United States Patent
Fujiwara et al.

(10) Patent No.: US 10,573,941 B2
(45) Date of Patent: Feb. 25, 2020

(54) BATTERY TEMPERATURE MANAGEMENT DEVICE

(71) Applicant: Kabushiki Kaisha Toshiba, Tokyo (JP)

(72) Inventors: Kenichi Fujiwara, Kawasaki Kanagawa (JP); Takahiro Yamamoto, Fuchu Tokyo (JP); Ryosuke Takeuchi, Shinagawa Tokyo (JP); Masatake Sakuma, Kiyose Tokyo (JP); Tomohiro Toyosaki, Fuchu Tokyo (JP); Takenori Kobayashi, Meguro Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 23 days.

(21) Appl. No.: 15/690,375

(22) Filed: Aug. 30, 2017

(65) Prior Publication Data

US 2018/0269546 A1 Sep. 20, 2018

(30) Foreign Application Priority Data

Mar. 17, 2017 (JP) .................................. 2017-053470

(51) Int. Cl.
  *H01M 10/617* (2014.01)
  *H01M 6/50* (2006.01)
  (Continued)

(52) U.S. Cl.
  CPC ............ *H01M 10/617* (2015.04); *G01K 3/04* (2013.01); *G01K 13/00* (2013.01); *G01R 31/382* (2019.01);
  (Continued)

(58) Field of Classification Search
  CPC ............. H01M 6/5011; H01M 6/5038; H01M 6/5044; H01M 10/482; H01M 10/486;
  (Continued)

(56) References Cited

U.S. PATENT DOCUMENTS

| 9,059,595 B2 | 6/2015 | Kikuchi | |
| 2008/0280192 A1* | 11/2008 | Drozdz | B60K 6/28 429/62 |

(Continued)

FOREIGN PATENT DOCUMENTS

| DE | 103 46 706 A1 | 5/2005 |
| JP | 2006-32013 | 2/2006 |

(Continued)

*Primary Examiner* — Rena Dye Cronin
(74) *Attorney, Agent, or Firm* — Finnegan, Henderson, Farabow, Garrett & Dunner, L.L.P.

(57) ABSTRACT

In one embodiment, a temperature management device is provided with a plurality of battery cells, power sensor(s) each of which detects the charge/discharge power of battery cell(s) at a prescribed time interval, a power representative value calculation section which calculates a power representative value of a time lapse data of the charge/discharge power(s) detected by the power sensor, temperature sensor(s) each of which detects the temperature of battery cell(s) at a prescribed time interval, a temperature representative value calculation section which calculates a temperature representative value of a time lapse data of temperature(s) detected by the temperature sensor, a radiation characteristic identification section which identifies a radiation characteristic from the temperature representative value and the power representative value, and an air conditioning setting calculation section which calculates an air conditioning setting for the battery cell(s) corresponding to the power representative value by using the radiation characteristic.

10 Claims, 9 Drawing Sheets

(51) Int. Cl.
  *H01M 10/48* (2006.01)
  *G01R 31/382* (2019.01)
  *G01R 31/396* (2019.01)
  *G01K 13/00* (2006.01)
  *G01K 3/04* (2006.01)
  *H01M 10/663* (2014.01)
  *H01M 10/613* (2014.01)
  *H01M 10/633* (2014.01)

(52) U.S. Cl.
  CPC ......... *G01R 31/396* (2019.01); *H01M 6/5011* (2013.01); *H01M 6/5038* (2013.01); *H01M 6/5044* (2013.01); *H01M 10/482* (2013.01); *H01M 10/486* (2013.01); *H01M 10/613* (2015.04); *H01M 10/633* (2015.04); *H01M 10/663* (2015.04)

(58) Field of Classification Search
  CPC ............. H01M 10/613; H01M 10/617; H01M 10/633; H01M 10/663; G01K 3/04; G01K 13/00; G01R 31/382; G01R 31/396
  See application file for complete search history.

(56) References Cited

U.S. PATENT DOCUMENTS

| | | | |
|---|---|---|---|
| 2010/0019729 A1 | 1/2010 | Kaita et al. | |
| 2010/0156356 A1* | 6/2010 | Asakura | H01M 10/44 320/148 |
| 2013/0302653 A1* | 11/2013 | Pham | H02J 7/00 429/50 |
| 2017/0338527 A1* | 11/2017 | Walton | H01M 10/613 |

FOREIGN PATENT DOCUMENTS

| | | |
|---|---|---|
| JP | 2013-200979 | 10/2013 |
| JP | 2014-203536 | 10/2014 |
| JP | 2015-133290 | 7/2015 |
| JP | 2016-61516 | 4/2016 |
| WO | WO 2008/095313 A1 | 8/2008 |
| WO | WO 2011/135701 | 11/2011 |

* cited by examiner

BATTERY TEMPERATURE MANAGEMENT DEVICE

CROSS-REFERENCE TO RELATED APPLICATION

This application is based upon and claims the benefit of priority from the prior Japanese Patent Application No. 2017-053470, filed on Mar. 17, 2017, the entire contents of which are incorporated herein by reference.

FIELD

Embodiments described herein relate generally to a temperature management device.

BACKGROUND

Regarding a storage battery, there is antinomy in which a charge/discharge amount of the storage battery is high when the temperature is high, but the lifetime of the storage battery becomes short when the temperature becomes high. In order to suppress the charge/discharge loss of the storage battery and the dispersion in the deterioration and the progress of deterioration of the storage battery, a proper temperature management thereof is required.

DETAILED DESCRIPTION

According to one embodiment, a temperature management device is provided with a plurality of battery cells, power sensor(s) each of which detects the charge/discharge power of battery cell(s) at a prescribed time interval, a power representative value calculation section which calculates a power representative value of a time lapse data of the charge/discharge power(s) detected by the power sensor, temperature sensor(s) each of which detects the temperature of battery cell(s) at a prescribed time interval, a temperature representative value calculation section which calculates a temperature representative value of a time lapse data of temperature(s) detected by the temperature sensor, a radiation characteristic identification section which identifies a radiation characteristic from the temperature representative value and the power representative value, and an air conditioning setting calculation section which calculates an air conditioning setting for the battery cell(s) corresponding to the power representative value by using the radiation characteristic.

Hereinafter, further embodiments of the present invention will be described with reference to the drawings. Ones with the same symbols show the corresponding ones. In addition, the drawings are schematic or conceptual, and accordingly, the relation between a thickness and a width of each portion, and a ratio of sizes between portions are not necessarily identical to those of the actual ones. In addition, even when the same portions are shown, the dimensions and the ratio thereof may be shown different depending on the drawings.

Figure 1:
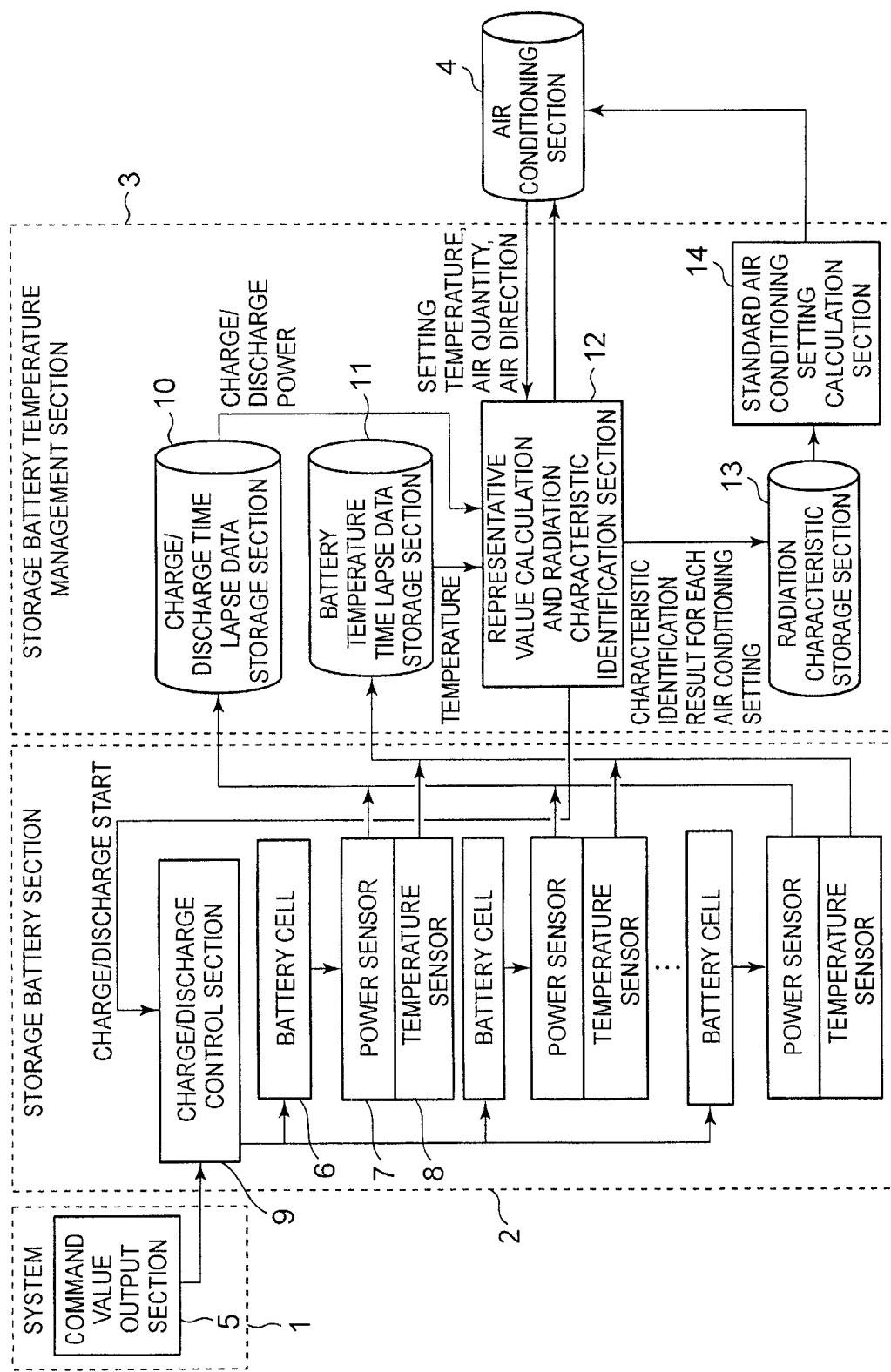
FIG. 1 is a block diagram of a temperature management device according to a first embodiment.

(First embodiment) FIG. 1 is a block diagram of a temperature management device according to a first embodiment.

A temperature management device according to the present embodiment identifies a radiation characteristic of a storage battery section 2, and can set an air conditioning setting for guaranteeing a lifetime of a storage battery for the charge/discharge amount. Here, the radiation characteristic indicates a characteristic of the radiation of the storage battery section 2. The identification means that a representative value calculation and radiation characteristic identification section 12 estimates a radiation characteristic $\alpha'$. To guarantee a lifetime of a storage battery indicates to keep a charge/discharge quality of the storage battery for a prescribed term.

The temperature management device according to the first embodiment includes a system 1, the storage battery section 2, a storage battery temperature management section 3 and an air conditioning section 4. The storage battery section 2 is provided with a plurality of battery cells 6. The system 1 supplies a power to the storage battery section 2, and has a command value output section 5. The command value output section 5 outputs a command value for performing charge/discharge to the storage battery section 2.

The storage battery section 2 performs charge/discharge by the command value from the command value output section 5, and includes a plurality of the battery cells 6 capable of performing charge/discharge, power sensors 7 each for detecting a charge/discharge power of each of the battery cells 6 at a prescribed time interval, temperature sensors 8 each for detecting a temperature of each of the battery cells 6 at a prescribed time interval, and a charge/discharge control section 9 which controls charge/discharge of each of the battery cells 6, upon receiving the command value from the command value output section 5 and a charge/discharge start command from the storage battery temperature management section 3.

In addition, the storage battery temperature management section 3 calculates a proper setting temperature of the air conditioning section 4 from the charge/discharge performed in the storage battery section 2, outputs the setting to the air conditioning section 4, and makes the air conditioning section 4 operate, to perform temperature management of the storage battery section 2. The storage battery temperature management section 3 includes a charge/discharge time lapse data storage section 10 for storing charge/discharge powers of the respective battery cells 6, and a battery temperature time lapse data storage section 11 for storing temperatures of the respective battery cells 6. In addition, the storage battery temperature management section 3 is also provided with the representative value calculation and radiation characteristic identification section 12, which includes a power representative value calculation section which calculates a power representative value that is a sum of effective values of the charge/discharge powers of the battery cells 6 from the charge/discharge powers stored in the charge/discharge time lapse data storage section 10, a temperature representative value calculation section which calculates a temperature representative value that is an average value of the temperatures stored in the battery temperature time lapse data storage section 11, and a radiation characteristic identification section which identifies a radiation characteristic from the temperature representative value calculated by the temperature representative value calculation section and the power representative value calculated by the power representative value calculation section. Further, the storage battery temperature management section 3 has a radiation characteristic storage section 13 which stores the radiation characteristic identified by the representative value calculation and radiation characteristic identification section 12, and a standard air conditioning setting calculation section 14 which evaluates the radiation characteristic and outputs an air conditioning setting used as a reference to the air conditioning section 4. The standard air conditioning setting is an air conditioning setting used as a reference.

The air conditioning section 4 is an air conditioning facility to which the air conditioning setting is inputted from the representative value calculation and radiation characteristic identification section 12 contained in the storage battery temperature management section 3, and which is provided for properly keeping the temperatures of the respective battery cells 6 of the storage battery section 2, such as an air conditioner. In addition, the air conditioning setting includes a setting temperature, an air quantity, and an air direction.

The representative value calculation and radiation characteristic identification section 12 calculates the power representative value from the charge/discharge powers of the respective battery cells 6 stored in the charge/discharge time lapse data storage section 10, and calculates the temperature representative value from the temperatures of the respective battery cells 6 stored in the battery temperature time lapse data storage section 11. In addition, the representative value calculation and radiation characteristic identification section 12 identifies the radiation characteristic from the temperature representative value and the power representative value and stores the radiation characteristic which has been identified for a certain air conditioning setting into the radiation characteristic storage section 13. Here, if the storage battery section 2 is not operated, the representative value calculation and radiation characteristic identification section 12 outputs a signal for starting charge/discharge to the charge/discharge control section 9 of the storage battery section 2. The representative value calculation and radiation characteristic identification section 12 repeats the operation described above for various air conditioning settings, and accumulates the radiation characteristics identified in the respective operations into the radiation characteristic storage section 13. When a prescribed number of the air conditioning settings are accumulated in the radiation characteristic storage section 13, the standard air conditioning setting calculation section 14 obtains a standard air conditioning setting which can guarantee the lifetime and maximally save energy in a definite air conditioning using this, and outputs it to the air conditioning section 4. The radiation characteristics to be stored in the radiation characteristic storage section 13 are stored in the form of a translation table from an air conditioning setting to a value of $\alpha'$, for example, and an example of its calculation method will be shown below.

Figure 2:
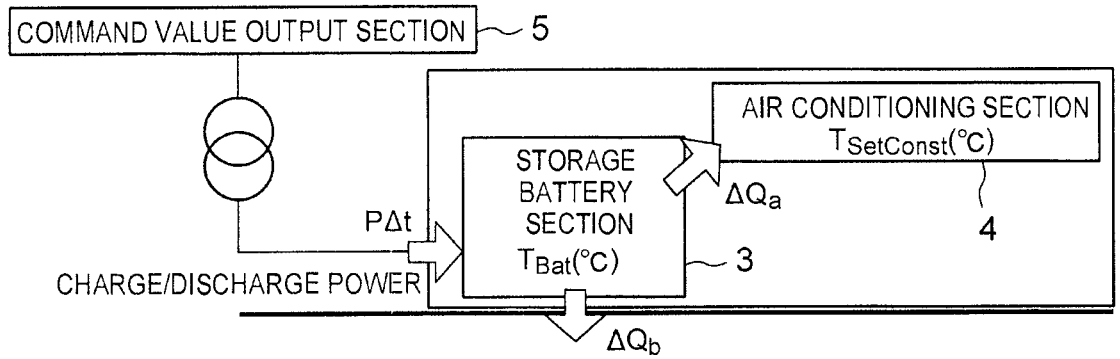
FIG. 2 is a diagram showing the balance of heat amount of the storage battery section 2 in the temperature management device according to the first embodiment.

FIG. 2 is a schematic diagram indicating the balance of heat amount of the storage battery section 2 in the temperature management device according to the present embodiment. Though a removed heat amount $\Delta Q_a$ by the air conditioning section 4 and a heat amount $\Delta Q_b$ which is exchanged with the outside through a battery container for containing the storage battery section 2 and the air conditioning section 4 are respectively unknown in the heat generated in the storage battery section 2 by charge/discharge, a balance of heat amount $\Delta Q$ of the storage battery section 2 in a time period $\Delta t$ can be expressed as $\Delta Q = \kappa P \Delta t - \alpha(T_{Bat} - T_{SetConst})\Delta t$. Here, $\Delta Q = \Delta Q_a + \Delta Q_b$, P is an absolute value of the charge/discharge power, $\kappa (>0)$ is a ratio of charge/discharge powers converted into heat to the charge/discharge powers, $T_{Bat}$ is a temperature representative value (° C.), $\alpha (>0)$ is a radiation characteristic (W/$\Delta$° C.). In addition, $T_{SetConst}$ is a setting temperature (° C.), and is constant. Further, when a heat capacity of the battery is set as C (W·s/$\Delta$° C.), an temperature increase $\Delta T (=\Delta Q/C)$ in the time period $\Delta t$ satisfies the expression (1).

$$\Delta T/\Delta t = (\kappa P - \alpha(T_{Bat} - T_{SetConst}))/C \qquad (1)$$

When integration is made for a sufficiently long time, while keeping the setting temperature to be constant, the left-hand side=0, and the expression (2) holds.

$$0 = \int(\kappa P(t) - \alpha T(t))dt = P_{\mathit{eff}} - \alpha \overline{T} \qquad (2)$$

Accordingly, the radiation characteristic $\alpha'$ is expressed as $\alpha' = \alpha/\kappa = P_{\mathit{eff}}/\overline{T}$ Here, $P_{\mathit{eff}}$ is an effective value of P, $\overline{T}$ is an average value of T ($=T_{Bat} - T_{SetConst}$) and $\alpha'$ is calculated using the effective value $P_{\mathit{eff}}$ and $\overline{T}$ such that $\overline{T}$ converges in a positive range obtained for a certain air conditioning setting.

Generally, $\alpha'$ is a function of an air conditioning setting (a setting temperature, an air quantity, an air direction). Regarding its function form, the execution result for all settings of each air conditioning is outputted as a correspondence table of an air conditioning setting and a value of $\alpha'$ to the radiation characteristic storage section 13, and the translation table may be held therein, or the function form may be complemented from values calculated in the several representative air conditioning settings. When a plurality of the air conditioning sections 4 exist, arguments of $\alpha'$ may be set for the all air conditioning sections 4, or may be set for the interlocking air conditioning sections 4.

Next, an example of a method of obtaining a standard air conditioning setting using the radiation characteristic function $\alpha'$ will be described. In order that the battery temperature does not have an increasing trend, and does not deviate from the lifetime guarantee range in an integration term, it is necessary that an expression (3) is satisfied.

$$P_{\mathit{eff}} - \alpha'(\overline{T_{Bat}} - T_{SetConst}) \leq 0 \text{ and} \qquad (3)$$

$$T_{Bat} = \frac{P_{\mathit{eff}}}{\alpha'} + T_{SetConst} < \text{a lifetime guarantee temperature}$$

Here $P_{\mathit{eff}}$ is a constant, and $\overline{T_{Bat}}$ is a time average of the battery temperature representative value. The standard air conditioning setting calculation section 14 searches the weakest setting that is an air conditioning setting capable of maximally saving energy, in the air conditioning settings satisfying the above-described expression, and outputs it to the air conditioning section 4.

Figure 3:
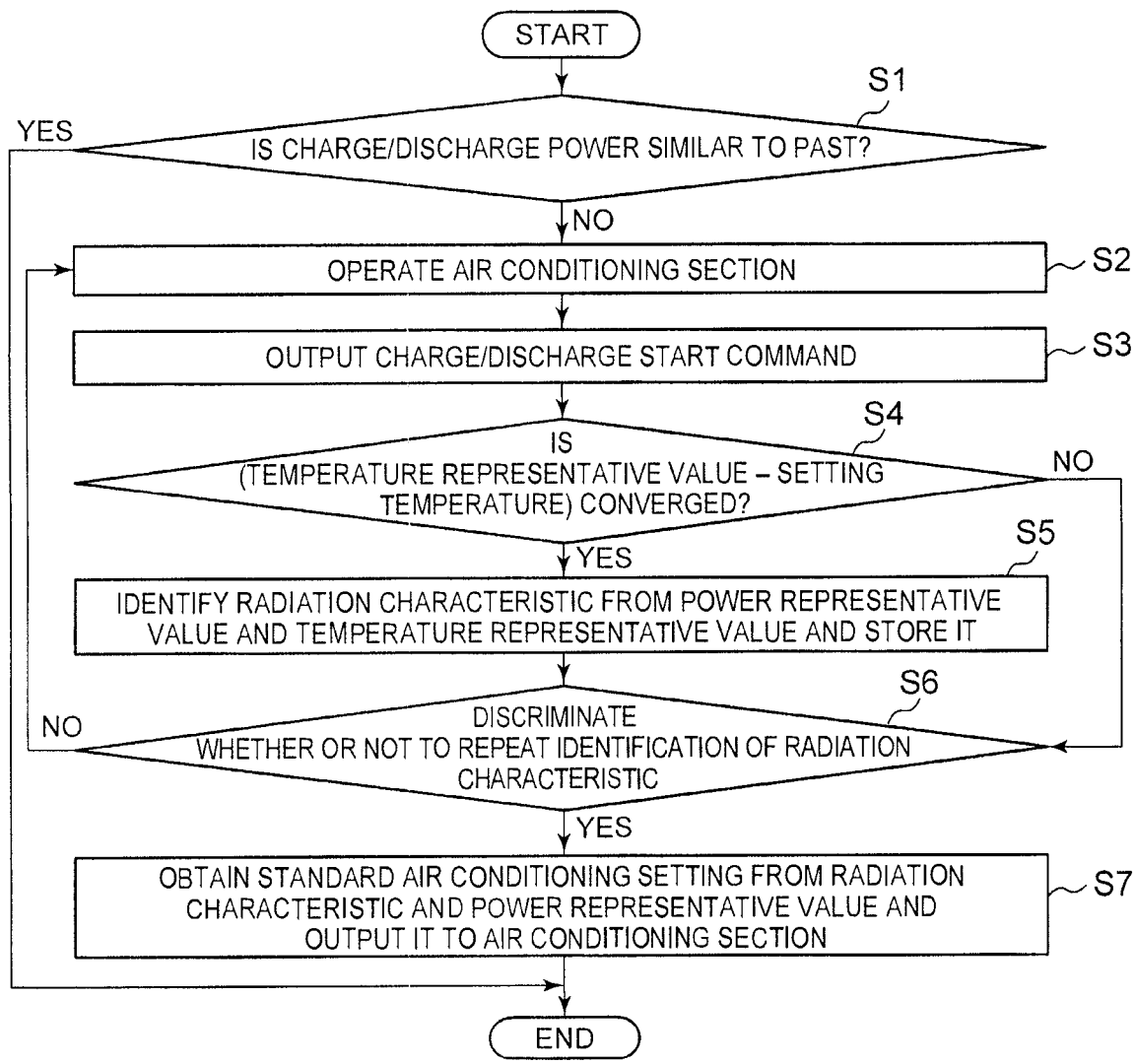
FIG. 3 is a flow chart for obtaining a standard air conditioning setting by the storage battery temperature management section 3.

In FIG. 3, a flow chart for obtaining a standard air conditioning setting by the storage battery temperature management section 3 is shown.

Whether charge/discharge powers inputted into the representative value calculation and radiation characteristic identification section 12 are similar to the past charge/discharge powers stored in the battery temperature time lapse data storage section 11 is discriminated (step S1). The case in which it is discriminated that they are similar in the step S1 will be described in second, fourth, fifth embodiments. When it is discriminated that they are not similar in the step S1, the representative value calculation and radiation characteristic identification section 12 makes the air conditioning section 4 operate with a proper air conditioning setting (step S2). As the air conditioning setting, a weakest setting (29° C. cooling, air quantity=weak, air direction=swing) may be set. When the charge/discharge has not been performed, the representative value calculation and radiation characteristic identification section 12 outputs a charge/discharge start command to the charge/discharge control section 9 so as to start charge/discharge (step S3). Next, the representative value calculation and radiation characteristic identification section 12 discriminates whether or not a value obtained by subtracting the setting temperature set as described above from the temperature representative value converges (step S4). When this value converges in the step S4, the representative value calculation and radiation characteristic identification section 12 identifies the radiation characteristic from the power representative value and the temperature representative value, and stores the identified radiation characteristic α' in the radiation characteristic storage section 13 (step S5). After the process of the step S5, or when the value has not converged in the step S4, the representative value calculation and radiation characteristic identification section 12 discriminates whether or not to repeat the identification of the radiation characteristic, regarding the air conditioning setting of another temperature or the like (step S6). When the discrimination to repeat the identification is made in the step S6, the processing is repeated from the step S1. When the discrimination not to repeat the identification is made in the step S6, the standard air conditioning setting calculation section 14 searches a weakest air conditioning setting in which the balance of heat amount during a prescribed term becomes minus, with respect to the battery performing the charge/discharge, so that the battery temperature is lifetime-guaranteed, and outputs the weakest air conditioning setting to the air conditioning section 4 as the standard air conditioning setting (step S7).

Since a charge/discharge trend and a position of the battery that is a heat source are different for each user, it has been difficult to perform a proper air conditioning setting according to a conventional method. However, the radiation characteristic is identified by the above-described method, and the battery temperature is kept within the lifetime guarantee range, the air conditioning setting capable of maximally saving energy is performed, and thereby the temperature management device according to the first embodiment performs an energy saving operation of the air conditioning within the lifetime guarantee range of the battery, and thereby the charge/discharge amount (profit) has been maximized.

In the example of FIG. 1, one power sensor 7 and one temperature sensor 8 are provided for each battery cell 6, but one power sensor 7 and one temperature sensor 8 may be provided for a plurality of the battery cells 6.

Figure 4:
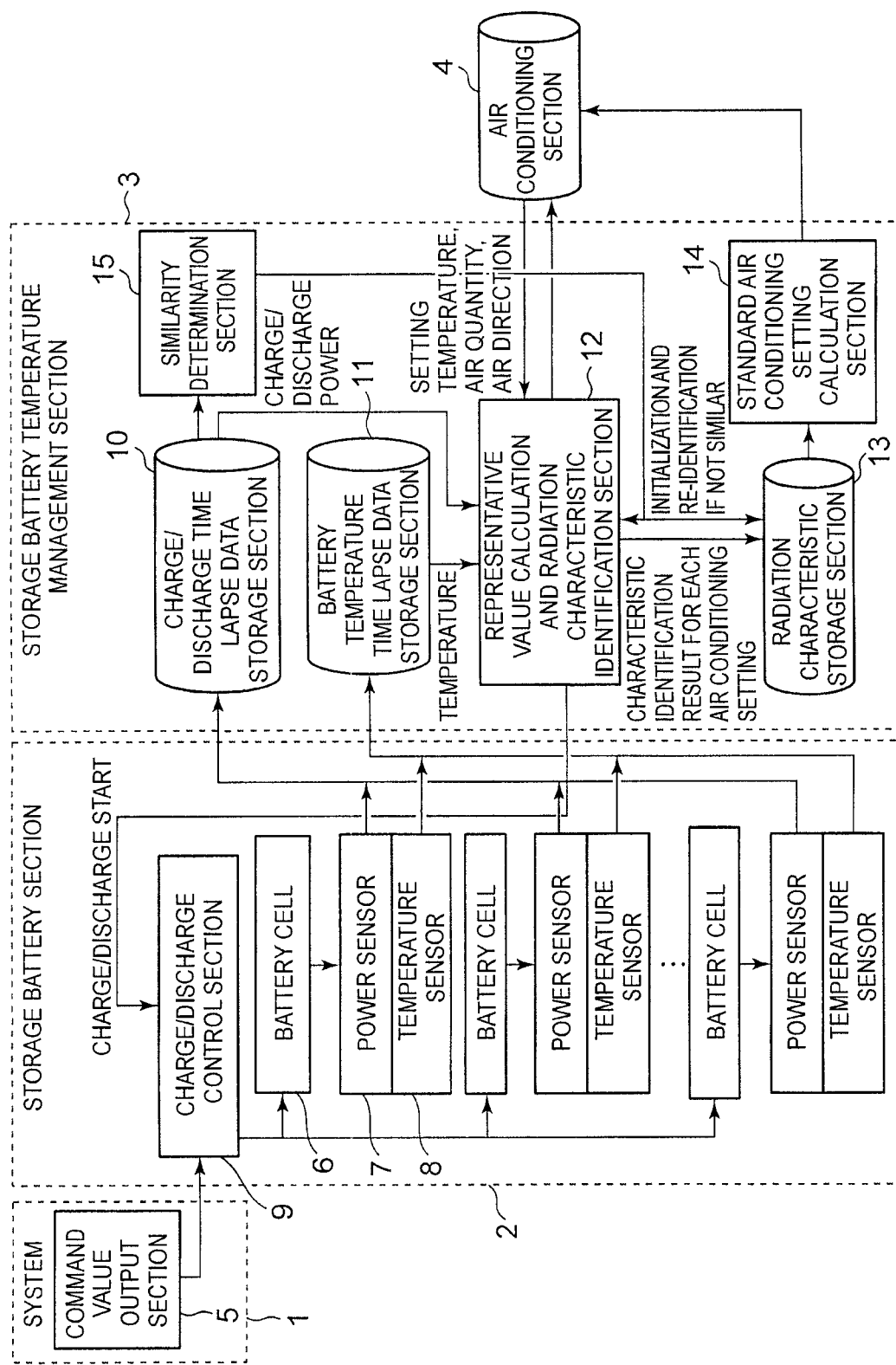
FIG. 4 is a block diagram of a temperature management device according to a second embodiment.

(Second embodiment) Only points different from the first embodiment will be described. In FIG. 4, a temperature management device according to a second embodiment is shown.

The temperature management device according to the second embodiment further has a change determination section 15 in the storage battery temperature management section 3.

The similarity determination section 15 determines whether or not the number and the arrangement of the battery cells 6 of the storage battery section 2 or the charge/discharge trend which the system 1 requires has changed, from the charge/discharge powers. Specifically, the similarity determination section 15 compares a histogram of the past charge/discharge time lapse data which the charge/discharge time elapse data storage section 10 has with a present histogram, and thereby may determine whether they have similar figures. When they are not similar, the past radiation characteristic identification result is deleted from the radiation characteristic storage section 13.

Only points different from the flow chart of the first embodiment will be described.

When the similar charge/discharge power is not present in the step S1 of FIG. 3, the identification result of the past radiation characteristics is deleted from the radiation characteristic storage section 13, and the processing follows the cycle of the step S2 or later. When the similar charge/discharge power is present, the processing is finished without executing any of the cycle of the step S2 or later.

When the trend of the command value from the command value output section 5, the number and arrangement of the battery cells 6 are changed by a user, the radiation characteristic may be changed. The similarity determination section 15 is provided and the above-described flow chart is executed for each prescribed term, for example, and thereby it is possible to deal with such a matter at a proper timing.

Figure 5:
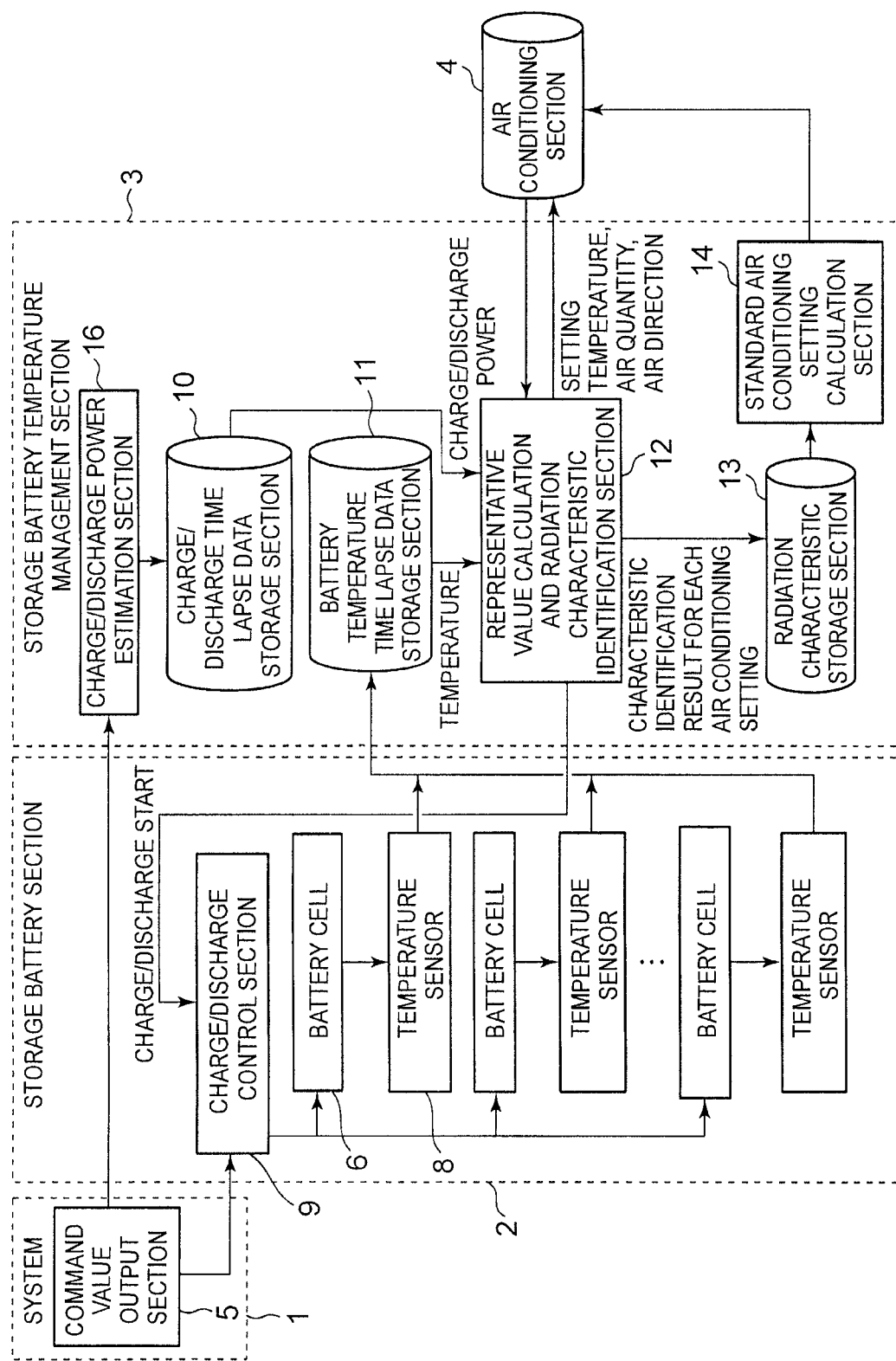
FIG. 5 is a block diagram of a temperature management device according to a third embodiment.

(Third embodiment) Only points different from the first embodiment and the second embodiment will be described. In FIG. 5, a temperature management device according to a third embodiment is shown. In FIG. 5, the power sensors 7 are omitted, and a charge/discharge estimation section 16 is provided instead.

Figure 6:
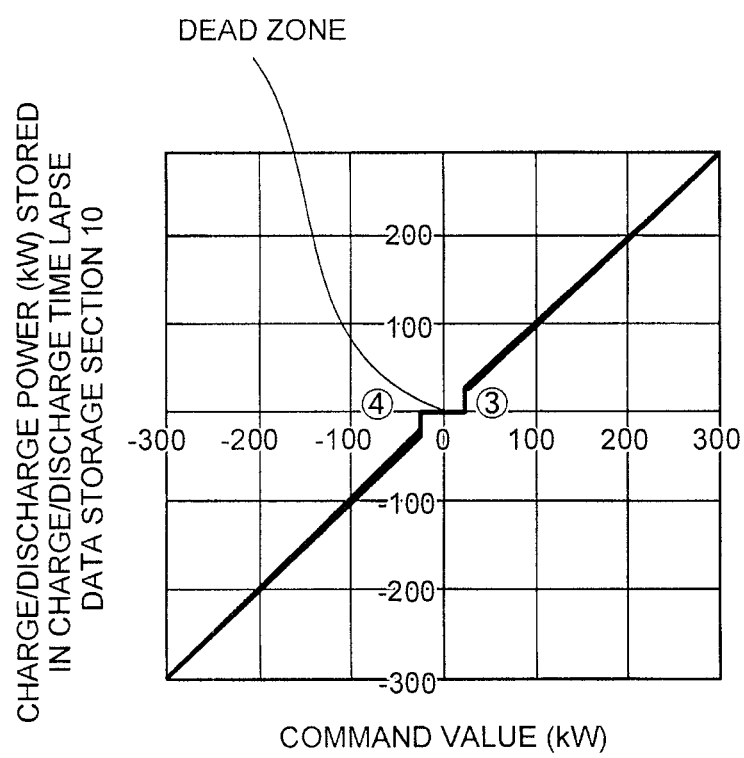
FIG. 6 is a diagram showing an example of a charge/discharge simulating function.

The temperature management device according to the third embodiment previously obtains the correspondence relation (a charge/discharge simulating function) between a command value and a charge/discharge power stored in the charge/discharge time lapse data storage section 10. An example of a charge/discharge simulating function is shown in FIG. 6. The charge/discharge estimation section 16 estimates a charge/discharge power based on the command value inputted from the command value output section 5 using this, and this estimated value is stored in the charge/discharge time lapse data storage section 10.

The charge/discharge simulating function becomes a linear function with an inclination 1 and an intercept 0, or a piecewise linear function having a dead zone near the origin as shown in FIG. 6. The range of the dead zone can be obtained from the standard information, without actually performing charge/discharge. A command value zone in which the battery 6 may not respond to the charge/discharge, as specified by the contract between a charge/discharge service provider and the system 1 side, for example, can be used as the standard information, for example.

Accordingly, the temperature management device according to the present embodiment can estimate the charge/discharge power by only the command value, and thereby can omit the power sensors 7. In addition, it is possible to suppress the calculation cost required for obtaining the power representative value from data of a large number of the power sensors 7.

Figure 7:
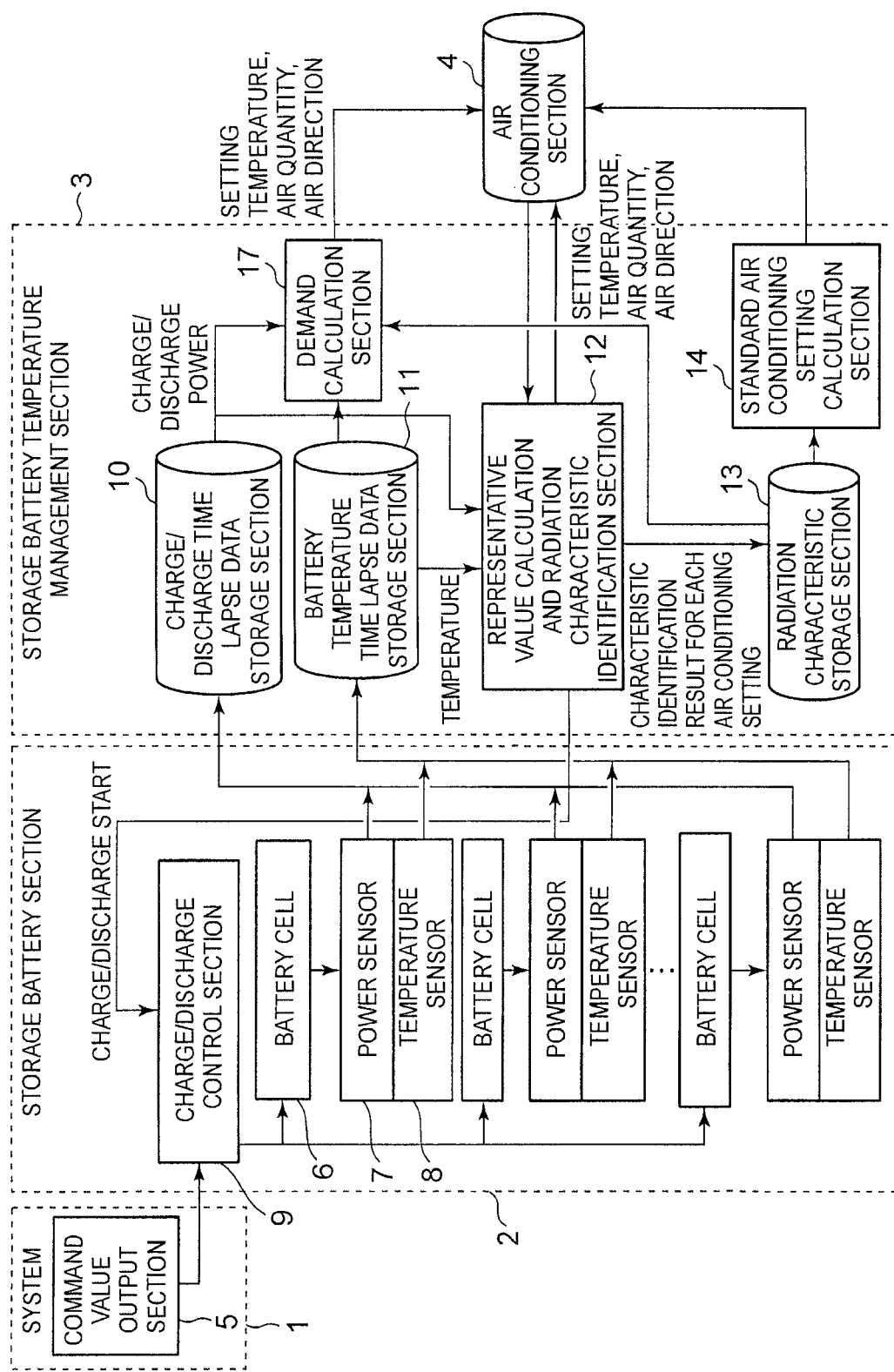
FIG. 7 is a block diagram of a temperature management device according to a fourth embodiment.

(Fourth embodiment) Only points different from the first embodiment, the second embodiment and the third embodiment will be described. In FIG. 7, a temperature management device according to a fourth embodiment is shown.

The temperature management device according to the fourth embodiment is further provided with a demand calculation section 17 in the storage battery temperature management section 3.

Only the standard air conditioning setting cannot timely deal with the temperature variation due to Joule heats generated by the irregular charge/discharge of the battery cells 6. As an example of the irregular charge/discharge, there exists charge/discharge larger than the effective value $P_{\mathit{eff}}$, for a shorter time compared with the integration time of the first embodiment, from several seconds to one or two minutes, for example. For the reason, the temperature management device according to the fourth embodiment further has the demand calculation section 17 which calculates Joule heats of the battery cells 6 from the charge/discharge powers which move randomly, and determines an air conditioning setting for removing the Joule heats using the radiation characteristic stored in the radiation characteristic storage section 13, and thereby deals with the irregular Joule heats.

Figure 8:
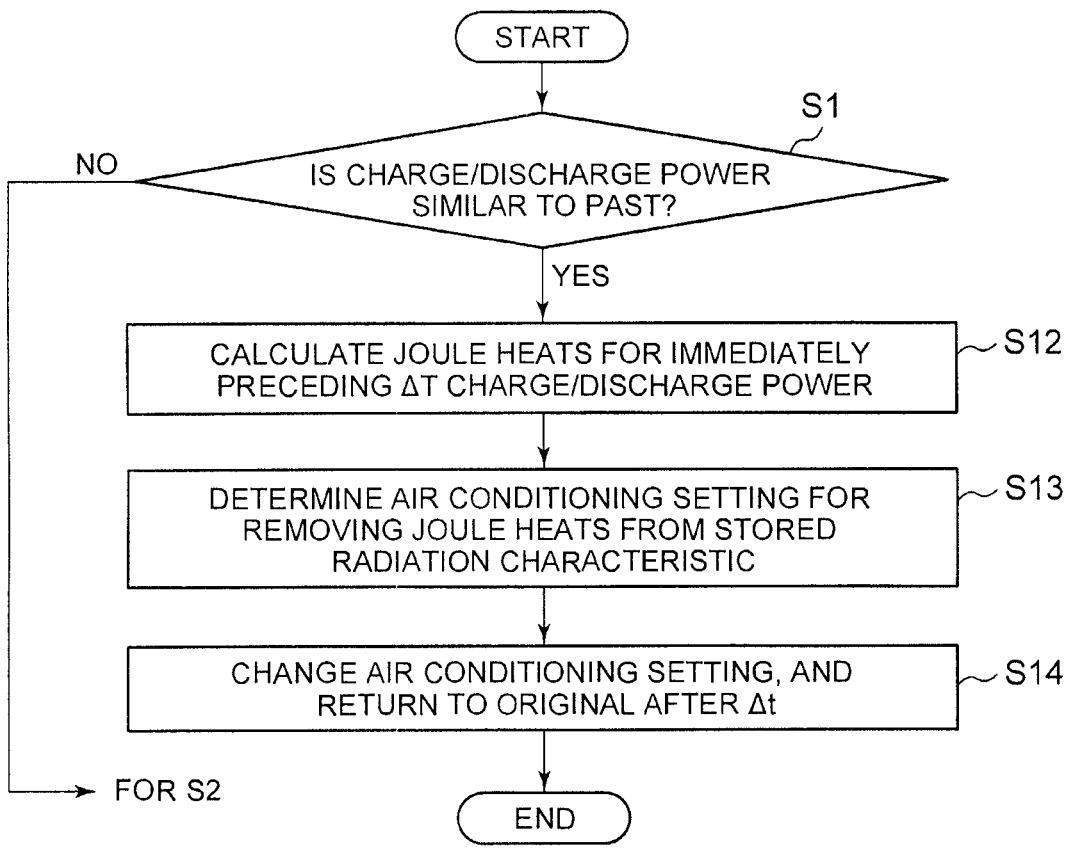
FIG. 8 is a flow chart when the standard air conditioning setting cannot deal with the temperature variation due to the Joule heats generated by the irregular charge/discharge of the respective battery cells 6.

In FIG. 8, a flow chart is shown when the standard air conditioning setting cannot timely deal with the temperature variation due to Joule heats generated by the irregular charge/discharge of the respective battery cells 6.

Whether the trend of the inputted charge/discharge powers is similar to the past charge/discharge powers stored in the battery temperature time lapse data storage section 11 is discriminated (step S1). When they are not similar in the step S1, the processing follows the step S2 and later of the flow chart of FIG. 3. When they are similar in the step S1, the demand calculation section 17 calculates Joule heats generated in the battery cells 6 by the immediately preceding irregular charge/discharge powers (step S12). Next, an air conditioning setting for removing the Joule heats is determined from the radiation characteristic stored in the radiation characteristic storage section 13 (step S13). The air conditioning setting is changed, and the air conditioning in this setting is continued only for a time corresponding to the irregular charge/discharge, and then the air conditioning setting is returned to the standard air conditioning setting (step S14).

Next, a specific change method which the demand calculation section 17 performs when the standard air conditioning setting cannot timely deal with the temperature variation due to Joule heats generated by the irregular charge/discharge of the battery cells 6 will be described. An air conditioning setting satisfying an expression (4) in which the air quantity is the weakest and the setting temperature is the highest (a setting temperature $T_{SetConst}$ and an air quantity), for the power representative value P and the average temperature $T_{Bat}$ of the whole battery cells 6 in a short time period $\Delta t$ is searched, and is outputted to the air conditioning section 4.

$$P-\alpha'(T_{Bat}-T_{SetConst})<0 \qquad (4)$$

According to a conventional method, the Joule heats due to the irregular charge/discharge of the battery cells 6 are propagated late via the battery and air, and the heat removing of the air conditioning is delayed, and thereby the battery temperature may deviate from the lifetime guarantee range, and an excess operation of the air conditioning may be generated for removing heat deriving from matters other than the battery cells 6. The temperature management device according to the fourth embodiment temporarily changes the air conditioning setting, in order to remove the Joule heats generated in the battery cells 6 from an accumulation value of the absolute values of the irregular charge/discharge powers (or the command value), and thereby it has become possible that the overheating of the battery cells 6 (and the excessive operation of the air conditioning are suppressed, and a risk of deviating from the battery guarantee range and useless air conditioning are reduced.

Figure 9:
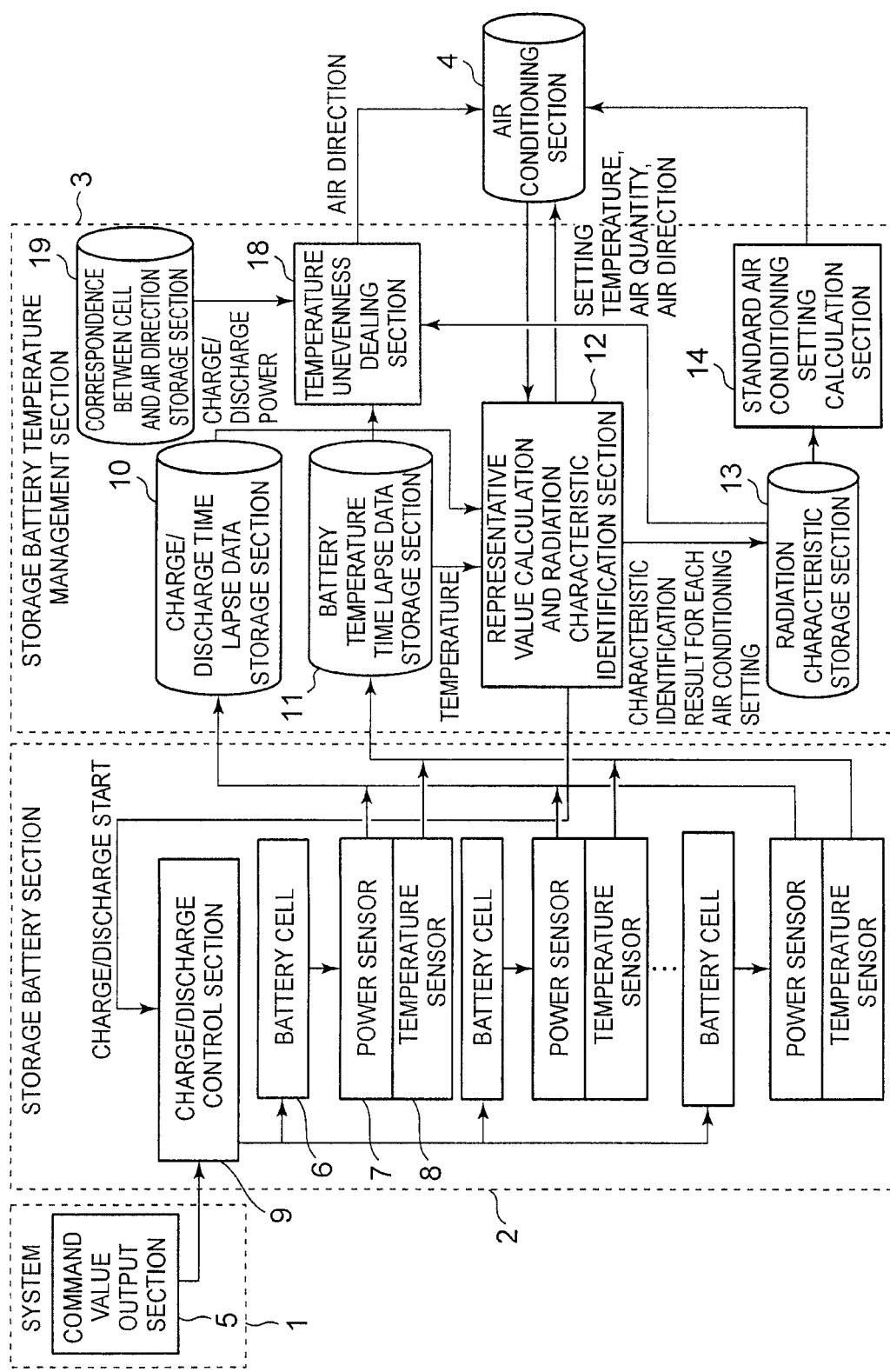
FIG. 9 is a block diagram of a temperature management device according to a fifth embodiment.

(Fifth embodiment) Only points different from the first embodiment, the second embodiment, the third embodiment and the fourth embodiment will be described. In FIG. 9, a temperature management device according to a fifth embodiment is shown.

The temperature management device according to the fifth embodiment further has a temperature unevenness dealing section 18 which specifies and deals with the battery cells 6 with temperature unevenness out of the whole battery cells 6, and a correspondence between battery cell and air direction storage section 19 which stores correspondence information of an air direction setting matched to a battery cell 6 which is to be preferentially heat-removed out of the whole battery cells 6. By this means, it is possible to uniformize the temperatures of the whole battery cells 6.

The temperature unevenness dealing section 18 discriminates whether temperature unevennesses searches the battery cell 6 with the highest temperature, when there are certain battery cells 6 with temperature unevenness above the prescribed value. The temperature unevenness dealing section 18 determines an air direction from the storage information of the correspondence between battery cell and air direction storage section 19, to change the air direction of the air conditioning section 4. In addition, when the temperature unevennesses are within the prescribed value, the temperature unevenness dealing section 18 does not change the air direction.

Figure 10:
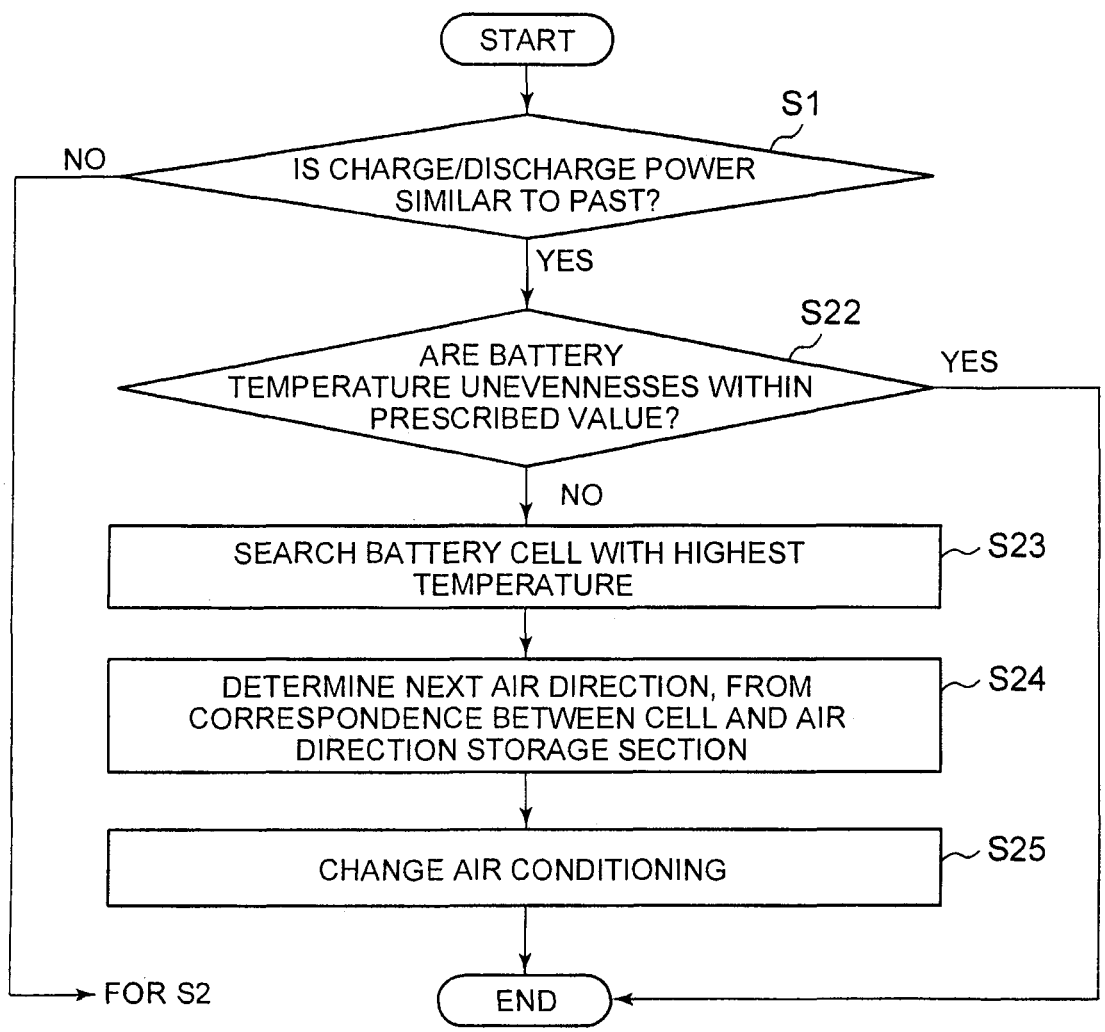
FIG. 10 is a flow chart when there are unevennesses in the temperatures of the respective battery cells 6.

In FIG. 10, a flow chart when there are unevennesses in the temperatures of the respective battery cells 6 is shown.

Whether or not the trend of the inputted charge/discharge powers is similar to the charge/discharge powers stored in the battery temperature time lapse data storage section 11 is discriminated (step S1). When they are not similar in the step S1, the processing follows the flow chart of FIG. 3. When they are similar in the step S1, the temperature unevenness dealing section discriminates whether the temperature unevennesses of the respective battery cells 6 are within a prescribed value (step S22). When they are not within the prescribed value in the step S22, the temperature unevenness dealing section 18 searches the battery cell 6 with the highest temperature (step S23). After the step S23, the temperature unevenness dealing section 18 determines an air direction of the air conditioning section 4 corresponding to the storage information of the correspondence between battery cell and air direction storage section 19 (step S24). And the temperature unevenness dealing section 18 changes the air direction of the air conditioning section 4 (step S25). When the temperature unevennesses are within the prescribed value in the step S22, the temperature unevenness dealing section 18 does not change the air direction of the air conditioning section 4.

Next, an example of a specific method for changing the air direction corresponding to the case in which the temperature unevennesses are out of the prescribed value will be shown.

The temperature unevenness dealing section 18 collects temperatures $\{T_{Celli}\}$ of the whole battery cells 6, and calculates a dispersion σ thereof and a highest temperature h (=max$\{T_{Celli}\}$), and does not transmit anything to the air conditioning section 4 (the immediately preceding air direction setting is taken over) when the dispersion σ is within a prescribed value. When the dispersion σ is out of the prescribed value, the temperature unevenness dealing section 18 specifies a number Celli of the battery cell 6 with the highest temperature h (=$T_{Celli}$), and transmits a new air direction corresponding to the number Celli to the air conditioning section 4. In addition, a standard deviation of the temperatures of the whole battery cells 6 may be used as the dispersion, for example.

In the conventional method, when the battery cells 6 are operated in the state that the respective temperatures thereof are different for a long term, dispersion is generated in the lifetimes of the battery cells 6, for example, and thereby the lifetime evaluation becomes difficult. The temperature management device according to the fifth embodiment changes the air direction so that the temperatures of the respective battery cells 6 are uniformized, and thereby the individual difference in the battery cells 6 regarding the progress of deterioration and the deterioration degree (or lifetime) has been suppressed, and the lifetime management cost has been reduced, such as the sampling number in the deterioration degree examination has been reduced, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A temperature management device comprising:
   a power representative value calculation section which calculates a power representative value of charge/discharge powers at a prescribed time interval detected by at least one power sensor provided for a plurality of battery cells;
   a temperature representative value calculation section which calculates a temperature representative value of temperatures at the prescribed time interval detected by at least one temperature sensor provided for the plurality of the battery cells;
   a radiation characteristic identification section which estimates a radiation characteristic from the temperature representative value calculated by the temperature representative value calculation section and the power representative value calculated by the power representative value calculation section, wherein the radiation characteristic is a function of an air conditioning setting, a temperature, and a charge/discharge power of a battery cell; and
   an air conditioning setting calculation section which calculates and outputs the air conditioning setting of the battery cells from the power representative value calculated by the power representative value calculation section and the radiation characteristic estimated by the radiation characteristic identification section.

2. The temperature management device according to claim 1, further comprising:
   a charge/discharge time lapse data storage section which stores the charge/discharge powers detected by the power sensor;
   a battery temperature time lapse data storage section which stores the temperatures detected by the temperature sensor; and
   a radiation characteristic storage section which stores the radiation characteristic estimated by the radiation characteristic identification section.

3. The temperature management device according to claim 2, further comprising:
   a change determination section which determines whether or not a number or an arrangement of the battery cells is changed from the charge/discharge powers stored in the charge/discharge time lapse data storage section.

4. The temperature management device according to claim 2, further comprising:
   a demand calculation section which calculates Joule heats to be generated in the battery cells from the charge/discharge powers stored in the charge/discharge time lapse data storage section, and determines the air conditioning setting to remove the Joule heats using the radiation characteristic stored in the radiation characteristic storage section.

5. The temperature management device according to claim 1, further comprising:
   a temperature unevenness dealing section which changes an air direction with respect to unevennesses of the temperatures of the respective battery cells, to uniformize the temperatures.

6. The temperature management device according to claim 1, wherein:
   the power representative value is an effective value of the charge/discharge powers of the respective battery cells.

7. The temperature management device according to claim 1, wherein:
   the temperature representative value is an average value of the temperatures of the respective battery cells.

8. The temperature management device according to claim 1, further comprising:
   an air conditioning section which is provided for properly keeping the temperatures of the respective battery cells; and
   a storage battery section comprising:
      the plurality of battery cells;
      a plurality of power sensors each of which detects the charge/discharge power of each of the battery cells at the prescribed time interval; and
      a plurality of temperature sensors each of which detects the temperature of each of the battery cells at the prescribed time interval.

9. The temperature management device according to claim 8, further comprising:
   a system supplies a power to the storage battery section, and has a command value output section that outputs a command value for performing charge/discharge to the storage battery section.

10. The temperature management device according to claim 8, further comprising a battery container that contains the storage battery section.

* * * * *